United States Patent

Nguyen et al.

[11] Patent Number: 5,825,659
[45] Date of Patent: Oct. 20, 1998

[54] METHOD FOR LOCAL RIP-UP AND REROUTE OF SIGNAL PATHS IN AN IC DESIGN

[75] Inventors: Lieu T. Nguyen, San Jose; Kwok Ming Yue, Fremont, both of Calif.

[73] Assignee: LSI Logic Corporation, Milpitas, Calif.

[21] Appl. No.: 491,433

[22] Filed: Jun. 16, 1995

[51] Int. Cl.[6] .................................................. H01L 23/50
[52] U.S. Cl. ......................................... 364/490; 364/488
[58] Field of Search ........................... 395/500; 364/578, 364/488–491

[56] References Cited

U.S. PATENT DOCUMENTS

| | | | |
|---|---|---|---|
| 4,855,929 | 8/1989 | Nakajima | 364/490 |
| 5,258,920 | 11/1993 | Haller et al. | 364/490 |
| 5,309,370 | 5/1994 | Wong | 364/490 |
| 5,550,748 | 8/1996 | Xiong | 364/488 |
| 5,587,923 | 12/1996 | Wang | 364/490 |

*Primary Examiner*—Kevin J. Teska
*Assistant Examiner*—Dan Fiul
*Attorney, Agent, or Firm*—Mitchell, Silberberg & Knupp LLP

[57] ABSTRACT

The present invention provides a local rip-up and reroute (LRR) method to reduce the number of open nets after the initial routers have been applied. Two main tasks are performed under this method. The first task is to identify a locally blocked pin and rip up wire segments in an area around the cell having the locally blocked pin. The second task is to reroute the now freed locally blocked pin. In the first task, an open net is read from the list of open nets. The pins of this open net are identified and determined if they are locally blocked. A pin is considered as locally blocked if a routing path, starting from the pin, cannot be found within N grid point expansions. If a pin is locally blocked, segments of wires within or at the boundary of a predefined bounding box are removed (or ripped-up)—except for two situations. The first exception is that a wire that is connected to a pin is not ripped-up. The second exception is that a SM wire segment that occupies only one horizontal track running through both boundaries of the bounding box is not ripped-up. The ripped-up nets are placed on a removed-net list for later rerouting.

24 Claims, 7 Drawing Sheets

METHOD FOR LOCAL RIP-UP AND REROUTE OF SIGNAL PATHS IN AN IC DESIGN

BACKGROUND OF THE INVENTION

1. Field of the Invention

The present invention relates generally to methods for use in the design of integrated circuits, and particularly to a routing method that reduces the number of open nets in an integrated circuit design after other routing methods have been applied.

2. Brief Description of the Prior Art

In the design of an integrated circuit (IC) such as an application specific integrated circuit (ASIC), the circuitry of the IC design is defined and stored in a computer database in terms of cells and their interconnections, where each cell can be an active component, passive component, or any special functional unit and the interconnections are the wire segments providing the signal paths between the cells.

After the IC design is stored in the computer, it is simulated on the computer by a simulator program and repeatedly tested and modified to ensure that the design provides the correct output signals for the given input signals, and that the operation of the IC design meets the given specification.

Once the testing of the integrated circuit design is satisfactorily completed, a wafer area of certain size and shape is determined, and the cells of the IC design are placed by simulation on the wafer area. This area represents the actual size and shape of the silicon wafer to be manufactured for the integrated circuit.

In organizing the cells, the cells are placed in such a manner as to minimize the amount of space used on the wafer and to minimize the length of wiring required to route the wire segments connecting the cells.

After the cells have been placed, the routing of the connections between the various terminals or pins of the cells is the next step, an aspect of which is the focus of this invention.

Note that a cell may be a simple active component, a simple logic component such as an AND gate, a special purpose logic component from a library collection, or any other special functional component. In any case, a cell has one or more input pins and one or more output pins.

Referring now to FIG. 1, an example of the layout of a cell 14 in an integrated circuit design is illustrated. The area for the integrated circuit design is evenly divided by grid points 10 for layout purpose. The distance 12 between the grid points is predefined and fixed. A cell 14 is placed on the grid points and includes two pins 16 and 17.

Each pin is routed to at least one other pin (not shown). In routing the connections, there are at least two layers available for routing, a first layer 13 and a second layer 15. Wiring on the first layer is commonly referred to as first metal (FM) and wiring on the second layer is commonly referred to as second metal (SM). To accommodate the maximum number of wires on each layer, first metal wires run vertically, or top to bottom and vice versa as depicted on the drawing, on the first layer of the IC design, and second metal wires run horizontally, or left to right and vice versa, on the second layer of the IC design. First metal wires are depicted by solid lines in the drawing and second metal wires are depicted by long dash lines. Second metal wires 20, 22 on the second layer 15 are connected to a first metal wire segment 24 by vias 28, 29 which connect wires from one layer to another layer. In some designs, there are three, four, or more layers available for routing of the wirings. The number of layers available for routing does not affect the applicability of the present invention.

Each of the pins, 16 and 17, occupies a small (shaded) area, 18 or 19, on the first layer such that a pin can only be connected by a second metal wire 22 or 23.

FIG. 2 illustrates an example of interconnected cells where there are four input signal lines and one output signal line. Cell 30, with two input pins 32 and 34 and one output pin 36, is connected to input pin 38 of cell 40. The other input pin 42 of cell 40 is connected to the output pin 44 of cell 46. Cell 46 has two input pins, 48 and 50, and cell 40 has one output pin 52.

There are two primary concerns in the routing of wires between the cells. The first concern is run-time speed. Run-time speed is important because the amount of computing power is limited. Although routers can be designed to attempt to complete all the wirings, they may not have a realistic or acceptable run-time speed. Thus, a router with fast run-time speed is desirable.

The second concern is the number of open nets remaining after all the routers have been applied to the IC design. A net is where two or more pins from two or more cells are designed to be connected. An open net is where the routers failed to complete all the connections in the net due to blockage or congestion. If there are open nets remaining after all the routers have been applied to the IC design, these open nets must be manually completed by an engineer, which can be a time consuming process conducive to human error. Thus, a router that can minimize the number of open nets remaining is highly desirable.

Generally, several routers are used to establish the initial routing of the connections. After these routers have been applied to the IC design, congestion of the pathways and/or blockage of pins may become a problem, and there may be a number of open nets yet to be completed. The present invention provides a routing method to be applied to the IC design after the initial routers have been applied. The preferred embodiment provides a router that reduces the number of open nets in the IC designs and has fast run-time speed.

In establishing the initial connections, a global router, a channel router, and a clean-up router can be used. The global router looks at the cells and their interconnections to determine a rough routing pattern. It also divides the mask into a number of conceptual channels for the channel router. A channel is comprised of two conceptual vertical cutlines where pins of cells are connected to either side of the channel. The channel router is a very fast router which completes the connection from one side of the channel to the other side of the channel. When the channel router finishes, typically there are still a number of open nets.

The clean-up router removes any left-over and unconnected wire segments remaining after the channel router has been applied to the IC design. It also attempts to complete any open nets by employing a maze algorithm to find routing paths on the design to complete the nets. The clean-up router is typically a very slow router.

At this point, where the initial routing of the connections have been completed, there may be a number of open nets, and these are the more difficult nets to complete. The present invention provides a routing method that focuses on completion of the remaining nets after other routers have been executed.

In the prior art, there are several techniques for this application. In one, a Final Touch Router (FTR) uses rip-up and reroute methods to reduce the number of open nets in a design. The FTR divides the boundary box that encloses open nets into tiles and removes all routing in these tiles. The FTR then uses a weighted maze algorithm to reroute each tile sequentially.

There are several problems with the FTR. Since the FTR removes all routing in the tiles and uses a maze algorithm to reconnect the routing, it requires a significant amount of computer run-time. Additionally, the FTR makes assumptions of global routing path and introduces pseudo-pins on the tile boundaries. These assumptions may fail for dense designs. It is also complex to implement.

Shove-Aside is another technique where existing wires are not removed, but are shoved closer together in order to create a new routing path for an open net. Shoving is done by reducing the distance between the grid points to create space for the new path and thereby reducing the distance between the wirings. The disadvantage with the Shove-Aside method is that it does not remove any routing which may be a bad commitment made by the previous routers. Also, reducing the distance between the grid points reduces the distance between routing paths which may introduce other problems at the manufacturing stage.

Another technique uses the sequential based rip-up and reroute strategy. In this method, connections are removed based on an analysis of the current blocking scenario and how the failed connections can be routed successfully.

The problem with the sequential based rip-up and reroute method is that it is a very time-consuming process because it removes wires sequentially until a failed connection is routed. This technique often results in unnecessary rip-up of wires.

There is also the hypergraph based rip-up and reroute strategy. In this technique, a hypergraph model is used to calculate a minimal set of nets that is blocking a connection. It is better than the above techniques because it has a global look-ahead analysis of the situation. However, this method requires a calculation of all the possible minimal sets of rip-up combinations, which is very time-consuming and complicated. Additionally, this technique is difficult to implement.

Thus, there is a need for a routing method that is fast and can reduce the number of open nets.

SUMMARY OF THE INVENTION

It is an objective of the present invention to provide a routing method for reducing the number of open nets in an IC design after other routing methods have been applied.

It is another objective of the present invention to provide a fast routing method for reducing the number of open nets in an IC design and thereby providing faster design turn around time.

It is yet another objective of the present invention to provide a method that is simple to implement.

The present invention provides a local rip-up and reroute (LRR) method to reduce the number of open nets after the initial routers have been applied. Two main tasks are performed under this method. The first task is to identify a locally blocked pin and rip up wire segments in an area around the cell containing the locally blocked pin. The second task is to reroute the now freed locally blocked pin. In the first task, an open net is read from the list of open nets. The pins of this open net are identified and determined if they are locally blocked. A pin is considered as locally blocked if a routing path, starting from the pin, cannot be found within N grid point expansions. A grid point expansion is defined a search attempt by a maze algorithm starting from a grid point to an adjacent grid point, and N is a number determined as a function of the cell size. If a pin is locally blocked, segments of wires within or at the boundary of a predefined bounding box are removed (or ripped-up)— except for two situations. The first exception is that a wire that is connected to a pin is not ripped-up. The second exception is that a SM wire segment that occupies only one horizontal track extending beyond both boundaries of the bounding box is not ripped-up. The ripped-up nets are placed on a removed-net list for later rerouting.

After ripping up the segments, the reroute task is performed. The maze algorithm is used to find a routing path from the now freed pin to other pins in the net. If a path is found and there are no other uncompleted connections in this net, this net is removed from the open-net list. Otherwise, if a path is not found, this net remains on the open-net list for later processing, and the ripped-up segments are restored to the IC design before the next open net from the open-net list is processed.

In an alternative embodiment, if a path is found for the open net, the net is completed only if the ripped-up nets can be routed as well so that there is an overall reduction of open nets or at least no additional open nets created. For example, if a path is found for the open net in question and there are three ripped-up nets created in the process, the open net is completed only if at least two of the three ripped-up nets can be completed as well, resulting in at least no additional open nets created. Otherwise, even though there may be a path found for the open net, it is not completed.

The LRR router is applied to an IC design after other routers have been applied. By locating a blocked pin, the present invention targets specifically the problem of local congestion. By removing segments of wires and vias in this area, routing resources are freed, and local congestion is resolved. Additionally, by not removing wires connected to a pin, as provided by the first exception, no additional pin would be locally blocked as a side effect of solving the locally blocked pin. By removing only wires that lie inside the bounding box, the area to process and the number of wires removed are limited. This reduces unnecessary rip-up and the number of open nets created by the rip-up. Thus, the present invention provides a fast algorithm to solve local congestion of pins and the corresponding open nets, providing an overall faster design turn-around time.

Finally, by rerouting nets in the described order, namely routing nets whose segments were ripped-up before processing the next open net, there is a high chance of completing the ripped-up nets.

The local rip-up and reroute method is applied to every open net in the open-net list. Testing of this method on a variety of integrated circuit designs shows a reduction of open nets up to 29% in certain IC designs.

A principal advantage of the present invention is that it provides a routing method which reduces the number of open nets in an IC design after other routing methods have been applied.

Another principal advantage of the present invention is that it provides a fast routing method which reduces the number of open nets in an IC design and thereby provides faster design turn around time.

Yet another advantage of the present invention is that it provides a method that is simple to implement.

These and other objects and advantages of the present invention will no doubt become apparent to those skilled in the art after having read the following detailed description of the preferred embodiment which is illustrated in the several figures of the drawing.

IN THE DRAWING

DESCRIPTION OF THE PREFERRED EMBODIMENT

Figure 1:
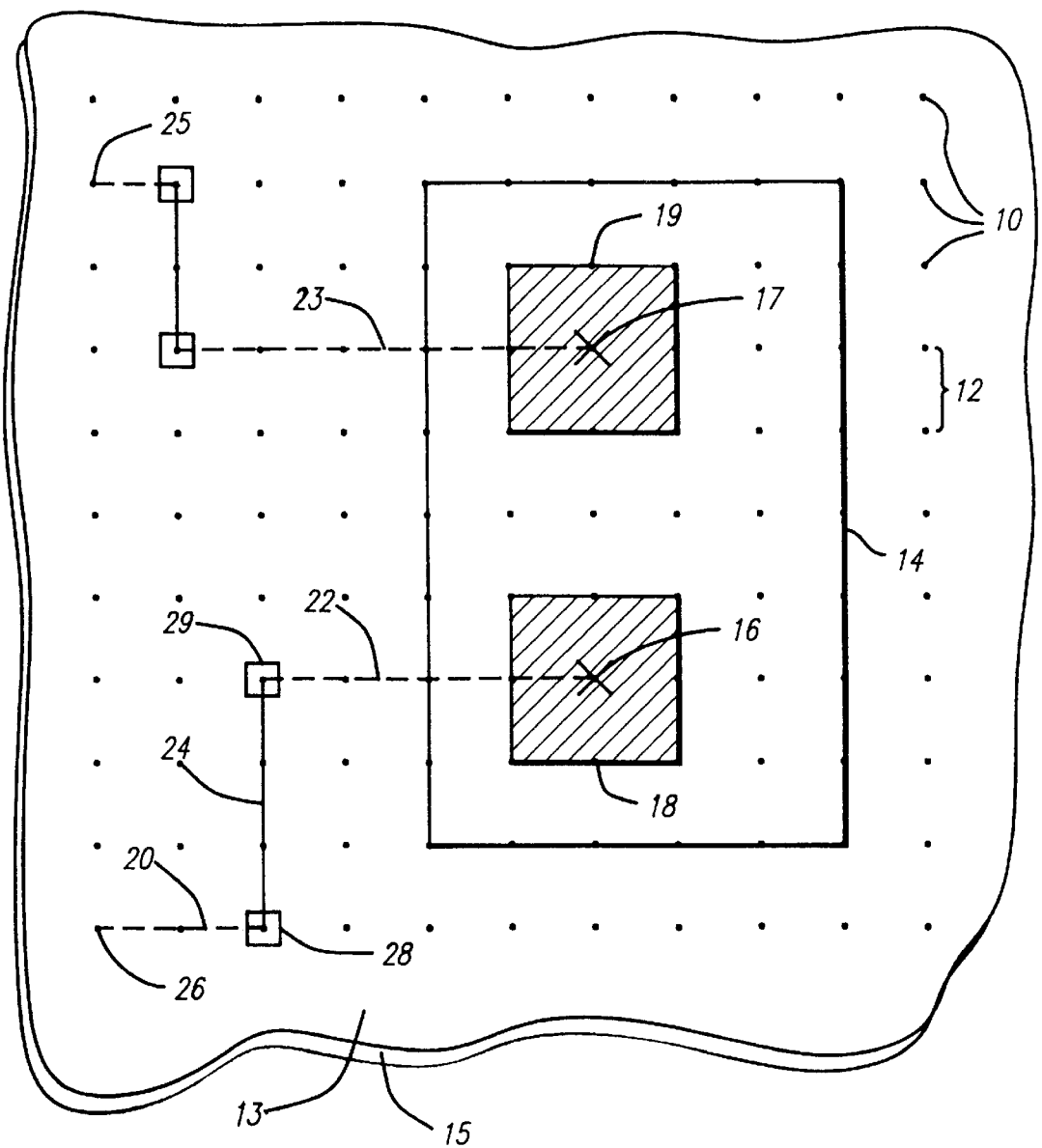
FIG. 1 illustrates various elements in an IC design showing a cell with two pins and two wires connecting to the pins.
Figure 2:
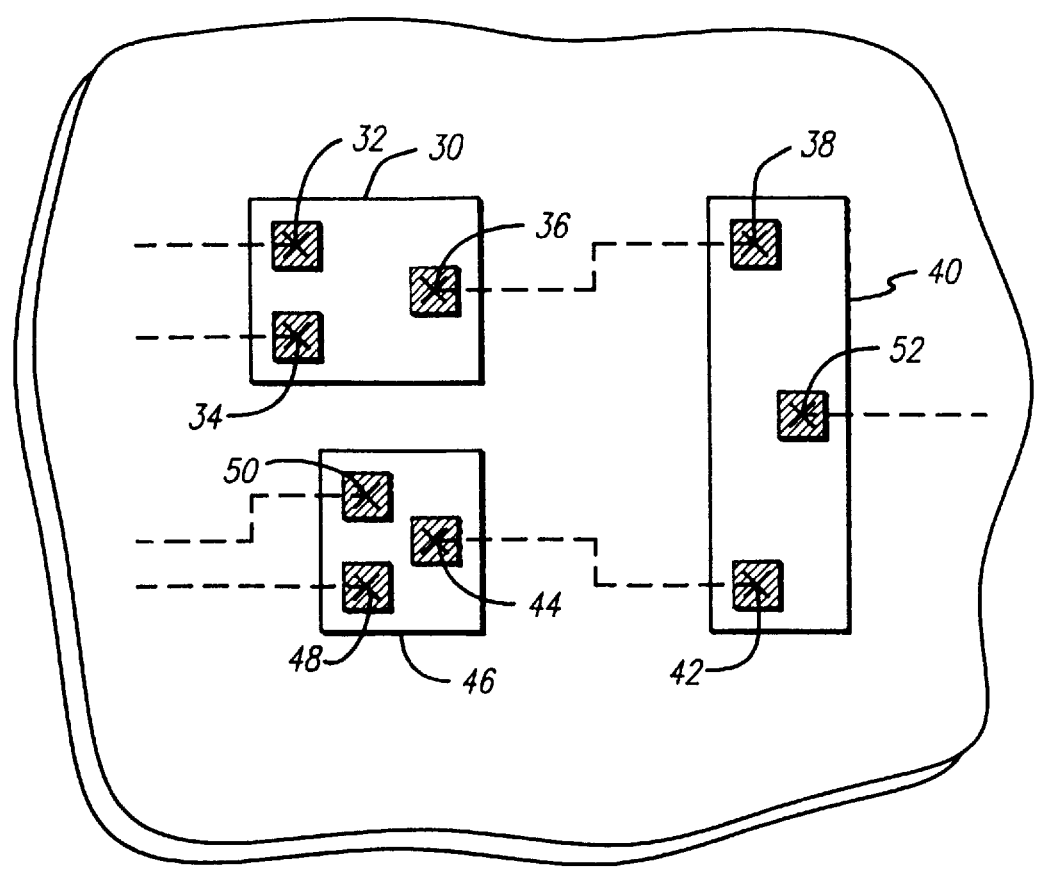
FIG. 2 illustrates an example of interconnections among three cells.
Figure 3:
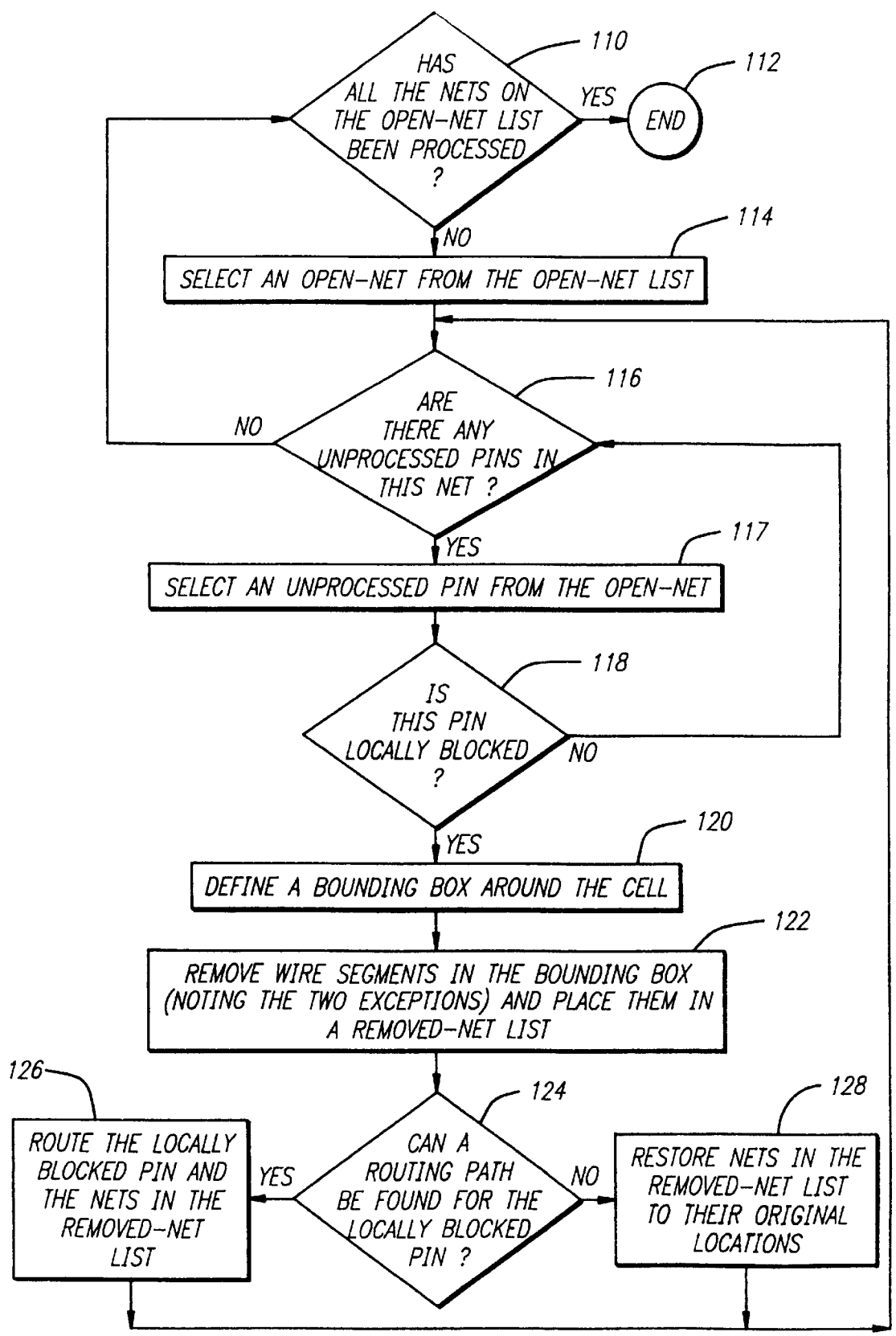
FIG. 3 is a flowchart illustrating the processing steps of the LRR router.

After other routers establish the initial connections in an IC design, the present invention provides an LRR router to collate the remaining uncompleted nets or open nets, store them in an open-net list, and process the open nets in the open-net list. Referring to FIG. 3, the router initially checks to see if there are any unprocessed open-nets in the open-net list 110. If all the open nets have been processed, the program ends 112. Otherwise, if there are unprocessed open-net, an open net is selected preferably from the top of the open-net list 114. In processing this open net, if all the pins in this open net have been processed (i.e. check for locally blocked situation), the next open-net from the open-net list is processed. Otherwise, a pin is selected from one of the cells in the open net 117. By using the maze algorithm a determination is made whether this pin is locally blocked or not 118. In the preferred embodiment, a pin is determined as locally blocked if no routing path is found within N grid point expansions, N being a function of the cell size. If a pin is determined as locally blocked, a bounding box is defined around the cell 120, and wire segments within the bounding box are removed (noting the two exceptions) and placed in a removed-net list 122. After the wire segments have been removed, the maze algorithm is used to find a routing path for the locally blocked pin. If a path is found, the pin is routed and the nets in the removed-net list are routed next 126. If a path cannot be found, the nets in the removed-net list are restored to their original locations 128. In both cases, the logic flows to process the next unprocessed pin if there any remaining unprocessed pins in this net.

In an alternative embodiment, if a path is found for the open net, the net is completed only if the ripped-up nets can be routed as well so that there is an overall reduction of open nets or at least no additional open nets created. For example, if a path is found for the open net in question and there are three ripped-up nets created in the process, the open net is completed only if at least two of the three ripped-up nets can be completed as well, resulting in at least no additional open nets created. Otherwise, even though there may be a path found for the open net, it is not completed.

Figure 4A:
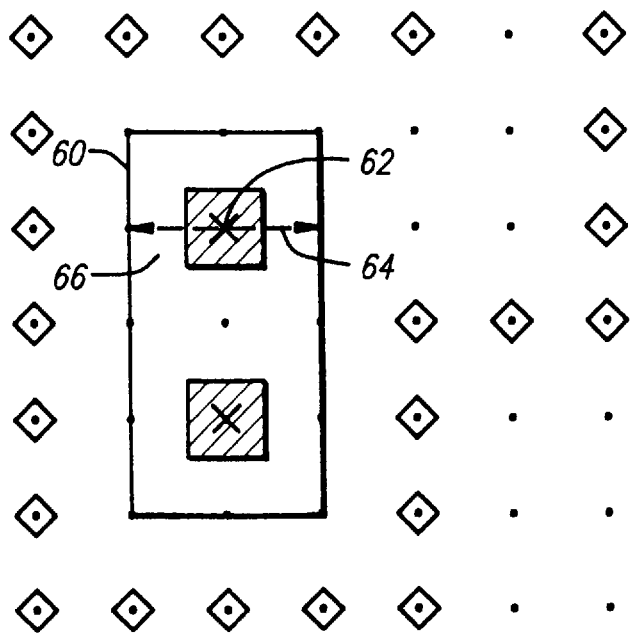
FIG. 4a illustrates the first expansion of the maze algorithm in a set of grid points; an occupied grid point is illustrated by a diamond over the grid point.

The maze algorithm is similar to wave form expansion. FIG. 4a illustrates the first expansion produced by the maze algorithm in a set of grid points. Occupied grid points are illustrated by a diamond over the grid point. For purpose of this discussion, we will look at pin 62 of cell 60.

Figure 4B:
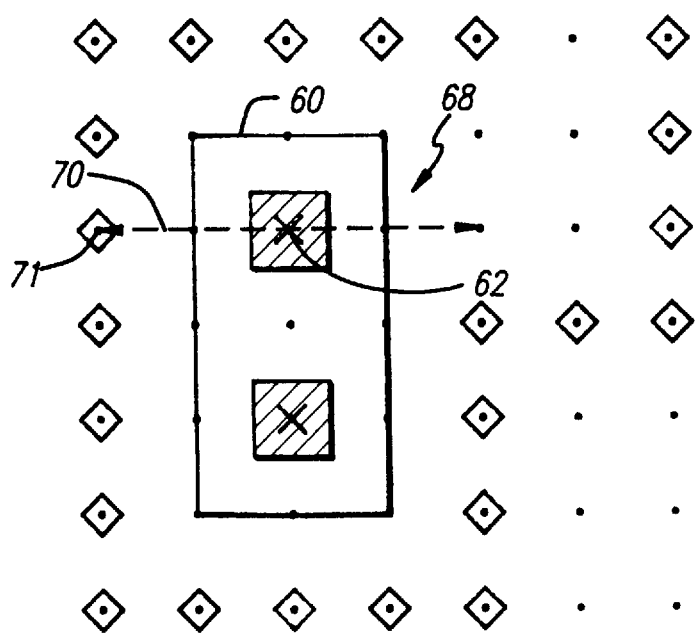
FIG. 4b shows the second expansion of the maze algorithm.

In determining whether an unconnected pin is locally blocked or not, the maze algorithm starts the expansions from the unconnected pin 62. Since the area inside the cell on the first layer is reserved for other uses, any connections to the pin must be made via the second metal. Thus, referring to FIG. 4a, the maze algorithm causes the first expansion to travel one grid point in both horizontal directions as illustrated by arrows 64 and 66. (Note that each arrow represents one grid point expansion.) Similarly, in the second expansion, referring to FIG. 4b, the maze algorithm starts from where the previous expansion ended and finds potential routing paths in the horizontal directions as illustrated by arrows 68 and 70. Note that previous expansions are represented by dotted lines on the drawing.

Figure 4C:
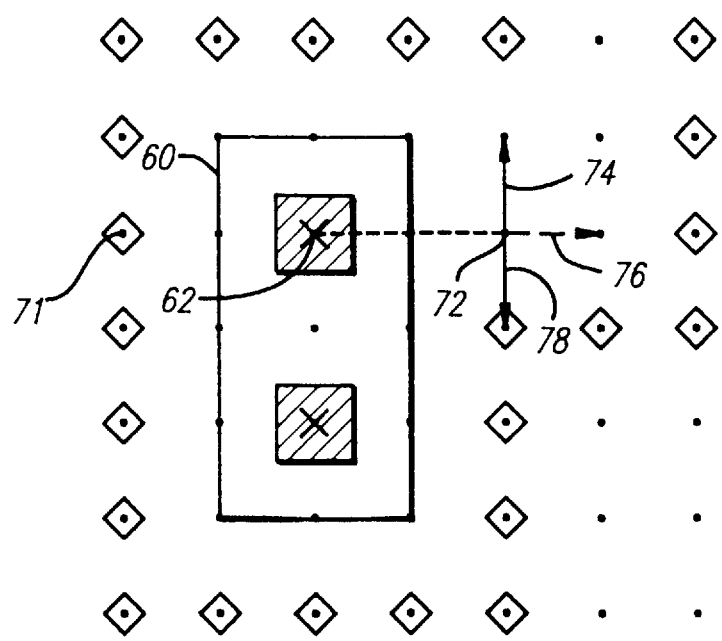
FIG. 4c shows the third expansion of the maze algorithm.
Figure 4D:
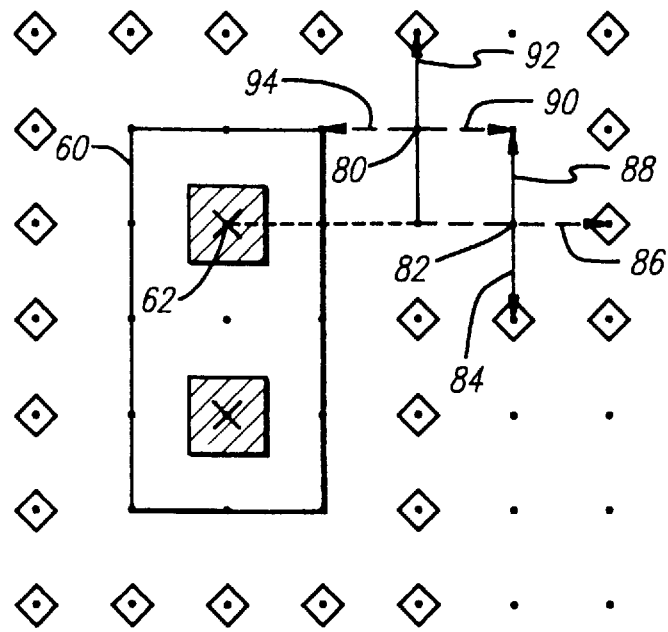
FIG. 4d shows the fourth expansion of the maze algorithm.
Figure 4E:
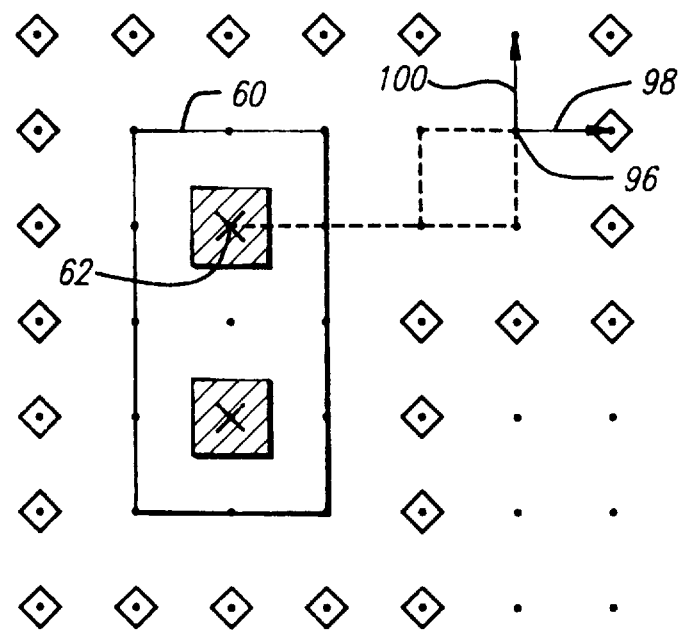
FIG. 4e shows the fifth expansion of the maze algorithm.

After the expansions leave the cell boundary and at an outside unoccupied grid point 72, the maze algorithm causes the third expansion to travel in the horizontal direction 76 and now possible vertical directions as illustrated by arrows 74 and 78 of FIG. 4c. Note that wiring on the first metal is along vertical paths and wiring on the second metal is along horizontal paths. On the other side of the cell, because grid point 71 is already occupied (as indicated by the diamond), no expansion occurs and no routing path consequentially exists. In the fourth expansion, referring to FIG. 4d, the expansion process starts from the grid points that are not blocked, 80 and 82, and expands to adjacent grid points in the vertical and horizontal directions as illustrated by arrows 84–94. FIG. 4e illustrates the fifth expansion which starts from the only unoccupied grid point 96 from the previous expansion and expands to adjacent grid points in the vertical and horizontal directions as shown by arrows 100 and 98 respectively. If there is no routing path available (all grid points occupied) after N grid point expansions, this unconnected pin is determined to be "locally blocked". Note that the user may specify the number of grid point expansions as a run-time parameter for the purpose of defining a locally blocked pin.

Figure 5A:
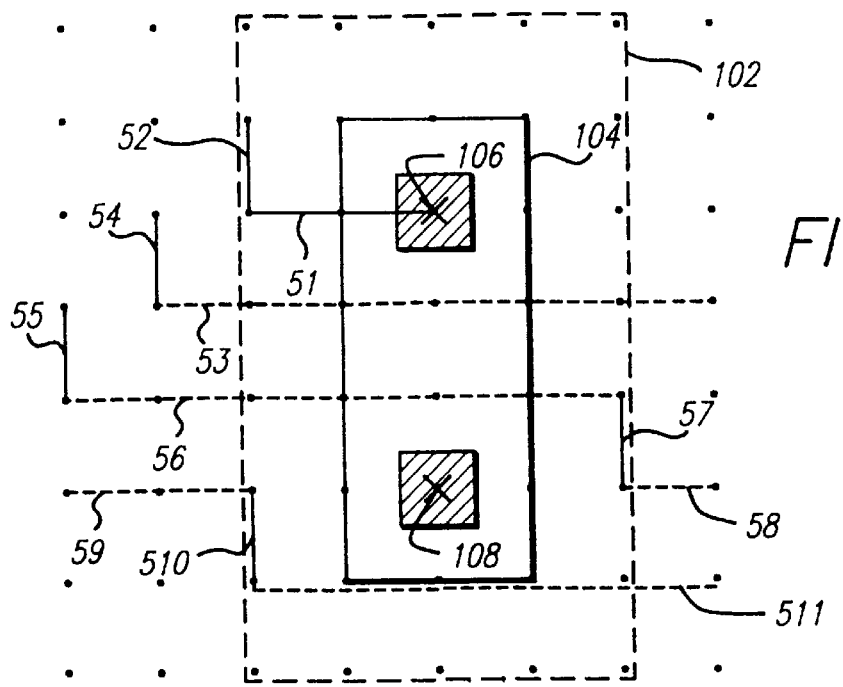
FIG. 5a illustrates a bounding box defined one grid point around a cell having a locally blocked pin.

Once a pin is identified as being locally blocked, referring to FIG. 5a where a locally blocked situation is illustrated at 108, a conceptual bounding box 102 is drawn spaced one grid space apart from the cell in the x-directions and flush with the cell in the y-directions. Here, cell 104 has two pins, 106 and 108, and pin 108 is illustrated as being locally blocked because of wire segments S7, S8, S9 and S10.

Then, all segments of wires lying within or at the boundary of the bounding box are removed—with two exceptions in the preferred embodiment. The first exception is that a wire segment connected to a pin is not removed. The second exception is that a wire segment in the second metal occupying only one horizontal track extending beyond both sides of the bounding box is not removed. Note that a segment herein is defined as a straight wire from a via or pin to another via or pin.

Figure 5B:
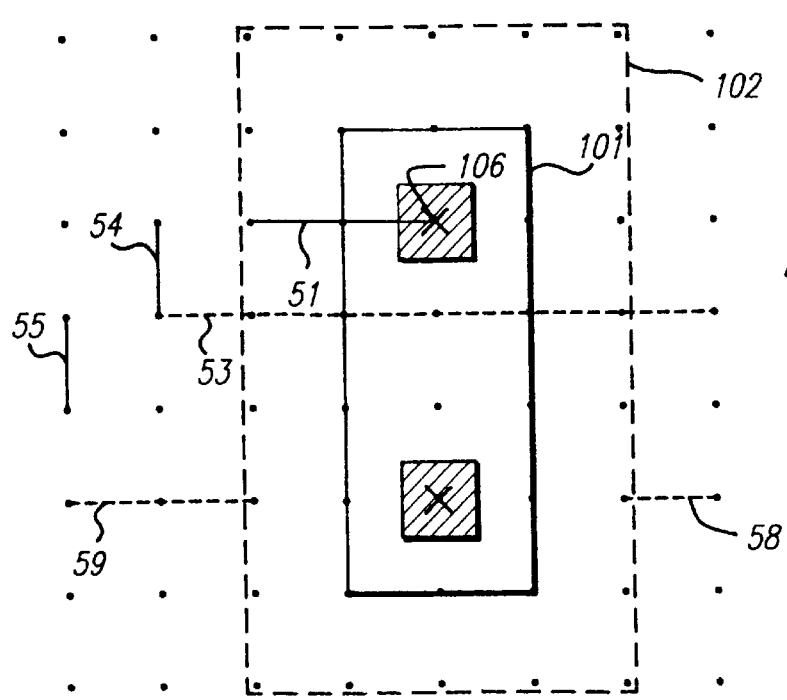
FIG. 5b illustrates the bounding box and cell after rip-out according to the present invention.

A number of wire segments are illustrated in FIG. 5a, and the rip-up or none rip-up of each one of them is explained as follows: Although segment S1 is within the bounding box 102, it is connected to a pin 106 and is not removed because of the first exception. Segment S2 lies at the boundary of the bounding box 102 and is thus removed. Segment S3 extends beyond both sides of the bounding box and is not removed because of the second exception. Segments lying outside of the bounding box, such as S4 and S5, are not removed. Segment S6 is removed because one side of the segment does not extend beyond the bounding box. Segments S7 and S10 lie at the boundary of the bounding box 102 and are removed. Segments S8 and S9 are removed because the segments touch the bounding box. Segment S11 is removed because it does not extend beyond both sides of the bounding box. FIG. 5b illustrates the segments remaining after the rip-up operation has been applied to the cell 104 containing the locally blocked pin 108.

Note that after a segment is removed, the corresponding grid points in the database are updated to reflect the unoccupied state of the grid points. In addition, since an open net is created when a segment is removed, this open net is placed in a removed-net list that will be processed before the next open net from the open-net list is processed.

After the rip-up operation, the locally blocked pin is rerouted using the maze algorithm. If the maze algorithm is successful in finding a routing path and completes the net, this net is removed from the open-net list. The open nets created due to removal of the segments in the rip-up operation are rerouted next. If any of the rip-up nets cannot be rerouted successfully, they are placed in the open-net list. When all of these rip-up nets are processed, the next open net from the open-net list is read and processed.

If the maze algorithm is unsuccessful in finding a routing path for the locally blocked pin, this open net is returned to open-net list, and the ripped-up segments are restored to their original locations to return the IC design to its original layout. The next open net is fetched from the open-net list and processed in the same manner as described above. Eventually, all the open nets in the open-net list are processed.

In an alternative embodiment, if a path is found for the open net, the net is completed only if the ripped-up nets can be routed as well so that there is an overall reduction of open nets or at least no additional open nets created. For example, if a path is found for the open net in question and there are three ripped-up nets created in the process, the open net is completed only if at least two of the three ripped-up nets can be completed as well, resulting in at least no additional open nets created. Otherwise, even though there may be a path found for the open net, it is not completed.

Note that in the preferred embodiment the bounding box 102 is spaced one grid away from the cell 104 in the x-directions, and all segments within the bounding box are removed with two exceptions. In alternative embodiments, the bounding box can be specified as a run-time parameter for both the x-directions and the y-directions. It can be the same size as the cell or one grids or more larger than the cell on all sides.

As a feature of the present method, the open-net list can be processed in ascending order, descending order, sorted order according to the net-span of the open net, or other specified orders. In some IC designs, processing order may affect the number of open nets completed.

Another feature of the present invention includes using a third layer first for routing in a three-layer design.

Implementation wise, all the pins within the cells of an open net are first checked to see if they are locally blocked. For those pins that are locally blocked, bounding boxes are established around the cells containing the locally blocked pins. The wire segments are removed from the bounding boxes as described above and the maze algorithm is executed to find routing paths between the cells of the open net.

It shall be understood that the LRR method can be used in conjunction with other routing methods to produce optimal reduction of open nets.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

We claim:

1. A method for determining a routing path to complete an open net in an integrated circuit design, said open net being completed by connecting pins of two or more cells of the net with wire segments extending along the determined routing path, said integrated circuit design being laid out on at least one layer that is evenly divided by arrays of grid points disposed on said layer, comprising the steps of:

a) selecting a pin from a cell of an open net;
　b) determining if said pin is locally blocked; and
　c) if said pin is locally blocked,
　　i) generating a bounding box along grid points circumscribing said cell and spaced therefrom a predetermined distance,
　　ii) removing existing wire segments within said bounding box, and
　　iii) finding a routing path from said pin to one or more designated pins within said net.

2. A method as recited in claim 1 wherein a number of open nets are created when existing wire segments are removed and further including the following steps:

iv) if an available routing path is found, routing said open net and the open nets created in step ii); and
　v) if an available routing path is not found, restoring the removed wire segments to their original locations in said integrated circuit design.

3. A method as recited in claim 2 wherein said pin is determined as locally blocked if a routing path is not found within a predetermined number of grid point expansions.

4. A method as recited in claim 3 wherein said bounding box is at least the same size as that of said cell.

5. A method as recited in claim 4 wherein as a first exception to said removing step, a wire segment connected to a pin of said cell is not removed.

6. A method as recited in claim 5 wherein as a second exception to said removing step, a wire segment passing through said bounding box on a second layer above or below said one layer is not removed.

7. A method as recited in claim 1 wherein said pin is determined as locally blocked if a routing path is not found within a predetermined number of grid point expansions.

8. A method as recited in claim 1 wherein said bounding box is at least the same size as that of said cell.

9. A method as recited in claim 1 wherein as a first exception to said removing step, a wire segment connected to a pin of said cell is not removed.

10. A method as recited in claim 1 wherein as a second exception to said removing step, a wire segment passing through said bounding box on a second layer above or below said one layer is not removed.

11. A method for finding a signal path between cells of an open net in an integrated circuit design, wherein each of said cells has at least one pin, comprising the steps of:

a) selecting a pin from a cell of said open net;
　b) determining if said pin is locally blocked;
　c) if said pin is locally blocked, removing existing wire segments within a bounding box surrounding said cell; and d) for the locally blocked pin, finding a routing path between pins of said cells of said open net.

12. A method as recited in claim 11 wherein said pin is determined as locally blocked if a routing path is not found within a predetermined number of grid point expansions.

13. A method as recited in claim 12 wherein said bounding box is at least the same size as that of said cell.

14. A method as recited in claim 13 wherein as a first exception to said removing step, a wire segment connected to a pin of said cell is not removed.

15. A method as recited in claim 14 wherein as a second exception to said removing step, a wire segment passing through said bounding box on a second layer above or below said one layer is not removed.

16. A method as recited in claim 11 wherein said bounding box is at least the same size as that of said cell.

17. A method as recited in claim 11 wherein as a first exception to said removing step, a wire segment connected to a pin of said cell is not removed.

18. A method as recited in claim 11 wherein as a second exception to said removing step, a wire segment passing through said bounding box on a second layer is not removed.

19. A method for finding a signal path between cells of an open net in an integrated circuit design, wherein each of said cells contains one or more pins, comprising the steps of:

a) determining if any of said pins of said cells are locally blocked;

b) removing existing wire segments within bounding boxes surrounding cells containing said locally blocked pins; and c) finding routing paths between said pins of said cells of said open net.

20. A method as recited in claim 2 wherein if an available routing path is found, routing said open net only if said open nets created in step ii) can be routed.

21. A method as recited in claim 3 wherein said cell is of a predetermined size and the number of grid point expansions is determined as a function of the size of said cell.

22. A method as recited in claim 7 wherein said cell is of a predetermined size and the number of grid point expansions is determined as a function of the size of said cell.

23. A method as recited in claim 12 wherein said cell is of a predetermined size and the number of grid point expansions is determined as a function of the size of said cell.

24. A method as recited in claim 2 wherein if an available path is found, routing said open net only if no overall additional open net is created.

* * * * *